United States Patent
Fogleman

(10) Patent No.: US 7,522,405 B2
(45) Date of Patent: Apr. 21, 2009

(54) HIGH CURRENT ELECTRICAL SWITCH AND METHOD

(75) Inventor: H. Frank Fogleman, Rancho Santa Fe, CA (US)

(73) Assignee: Perfect Switch, LLC, San Diego, CA (US)

( * ) Notice: Subject to any disclaimer, the term of this patent is extended or adjusted under 35 U.S.C. 154(b) by 432 days.

(21) Appl. No.: 11/135,232

(22) Filed: May 23, 2005

(65) Prior Publication Data

US 2006/0261368 A1    Nov. 23, 2006

(51) Int. Cl.
*H02B 1/00* (2006.01)
*H01L 27/10* (2006.01)

(52) U.S. Cl. .................. 361/601; 257/107; 257/202; 257/203; 257/341; 257/736; 174/260; 174/252

(58) Field of Classification Search ............. 257/202, 257/203, 341, 107, 736; 174/260, 252; 218/69; 361/601

See application file for complete search history.

(56) References Cited

U.S. PATENT DOCUMENTS

| | | | |
|---|---|---|---|
| 4,390,763 A * | 6/1983 | Hruda | 218/6 |
| 5,528,446 A | 6/1996 | Sankaran et al. | |
| 6,366,486 B1 | 4/2002 | Chen et al. | |
| 6,494,723 B2 | 12/2002 | Yamane et al. | |
| 2001/0045777 A1 | 11/2001 | Onizuka et al. | |
| 2002/0076851 A1* | 6/2002 | Eden et al. | 438/106 |
| 2002/0109951 A1 | 8/2002 | Grisoni | |
| 2004/0037044 A1 | 2/2004 | Cook et al. | |
| 2004/0104489 A1* | 6/2004 | Larking | 257/787 |

FOREIGN PATENT DOCUMENTS

| | | |
|---|---|---|
| EP | 0751601 A3 | 10/1998 |
| WO | WO 00/59094 A3 | 10/2000 |

* cited by examiner

*Primary Examiner*—Kenneth A Parker
*Assistant Examiner*—Joseph Nguyen

(57) ABSTRACT

A method and system are disclosed for a high current electrical switch. The switch may be suitable for switching, rectifying or blocking direct current in the range of one to a thousand amperes per module or assembly. It does so with such high efficiency that it produces relatively insignificant heat; such that it requires little or no cooling by convection or radiation. The relatively low heat that is generated in the process is conducted away quite effectively by the electric cables connected to the device.

18 Claims, 4 Drawing Sheets

HIGH CURRENT ELECTRICAL SWITCH AND METHOD

BACKGROUND OF THE INVENTION

1. Field of the Invention

The present invention relates in general to a high current electrical switch and a method of making it. It more particularly relates to such a high current electrical switch and method that has little or no need for a heat sink for many applications.

2. Background Art

The information contained in this section relates to the background of the art of the present invention without any admission as to whether or not such background art legally constitutes prior art.

Generally, the applications requiring direct current in the range of fifty to five hundred amperes will be found in systems operating in the voltage range of ten to a hundred volts. This window of electric power is found on board cars, trucks, boats, airplanes, recreational vehicles, telecom systems, photovoltaic systems wind power systems, oceanographic buoys, etc.

In recent years, MOSFET switches have been popular in computer systems, combining redundant power systems and/or batteries with a computing system such as a server, memory, and/or network. The limiting factor in most applications has been the resistance in the device from the drain to the source when the device is on, or the $R_{ds(on)}$ factor. This factor has been steadily reduced over the recent years by MOSFET manufacturers from sub-ohms to milli-ohms. Currently, devices with voltage ratings of 30 to 50 volts are available with an $R_{ds(on)}$ as low as 1.5 to 20 milli-ohms. As this parameter has asymptotically approached the one milli-ohm level, the package resistance (leadframe, wire bonds, etc.) limits much greater improvement. In the application of these high conductivity devices, the external resistances begin to swamp the improvement achieved in the MOSFET. The $R_{ds(on)}$ increases significantly (about a percent per degree Celsius) as the device temperature rises while conducting high currents.

To dissipate this temperature increase, the MOSFETs are placed on large costly heat sinks to carry away the heat produced as a result of the voltage drop. If these heat sinks are inadequate to avoid excessive heating of the MOSFETs, the MOSFETs may be destroyed. The common practice is to decrease the resistance between the MOSFET and its source and load as much as possible by increasing pad sizes, trace widths, trace thickness, and wire gauge, while decreasing trace lengths, wire lengths, and connector resistance within the limits imposed by the heat sink system.

BRIEF DESCRIPTION OF THE DRAWINGS

In the following is a brief description of the drawings.

DESCRIPTION OF CERTAIN EMBODIMENTS OF THE INVENTION

Figure 1:
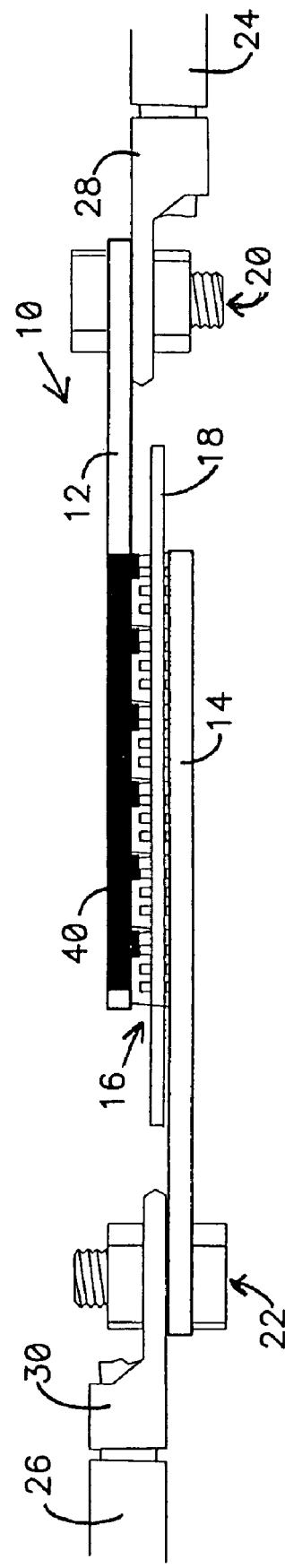
FIG. 1 is a side view of a first embodiment of a high current electrical switch.

It will be readily understood that the components of the embodiments, as generally described and illustrated in the drawings herein, could be arranged and designed in a wide variety of different configurations. Thus, the following more detailed description of the embodiments of the system, components and method of the present invention, as represented in the drawings, is not intended to limit the scope of the invention, as claimed, but is merely representative of the embodiment of the invention.

A method and system are disclosed for a high current electrical switch. The switch may be suitable for switching, rectifying or blocking direct current in the range of one to a thousand amperes per module or assembly. It does so with such high efficiency that it produces relatively insignificant heat; such that it requires little or no cooling by convection or radiation. The relatively low heat that is generated in the process is conducted away quite effectively by the electric cables connected to the device.

In accordance with a disclosed embodiment of the invention, there is provided a high current electrical switch system and method, which includes a first primary conductor, a second primary conductor, and an array of switching elements. The switching elements electrically connect the first primary conductor and the second primary conductor and are physically sandwiched between the first primary conductor and the second primary conductor. The array of switching elements has a resistance of less than about 500 micro-ohms.

According to another aspect of a disclosed embodiment of the invention relates to providing an array of switching elements connected in parallel between a first conductor and a second conductor, electrically connecting together each gate lead from each switching element, and controlling the switching elements via the gate leads to close switching elements to allow current to flow from the first conductor to the second conductor and to open the switching elements to not allow the current to flow from the first conductor to the second conductor. The array of switching elements is sandwiched between the first conductor and the second conductor.

As shown in FIGS. 1-4, a high current electrical switch using a 2 by 6 array of switching elements, generally referenced as 10, is shown. The switch 10 includes a first primary conductor in the form of a rectangular bar 12, a second primary conductor in the form of a rectangular bar 14, an array 16 of switching elements 34, and a printed circuit board 18. Cables 26, 28 terminating in ring terminals 30, 32 may be attached by fasteners 20, 22 to the first rectangular bar 12 and the second rectangular bar 14, respectively.

Array 16 may include twelve switching elements 34, such as International Rectifier's IRF2804S-7P MOSFET or other switching devices. Other numbers of switching elements and other arrangements of the switching elements may also be employed. Each of the switching elements 34 may include a drain lead (not shown) as the bottom side of the switching element 34. The drain lead is soldered directly to the surface of the second rectangular bar 14.

Each of the switching elements may further include a plurality of leads extending from one end of the switching device 34. A plurality of source leads 36 from each switching element 34 may be connected at a point adjacent to the body of the switching device 34 to the first rectangular bar 12 via metal strip 40. Metal strip 40 may be soldered directly or otherwise to a side of first rectangular bar 12 and may include a number of tabs 42 which extend to and are soldered to the source leads 36. The gate lead 38 of each switching element 34 may be connected to the printed circuit board 18.

Figure 2:
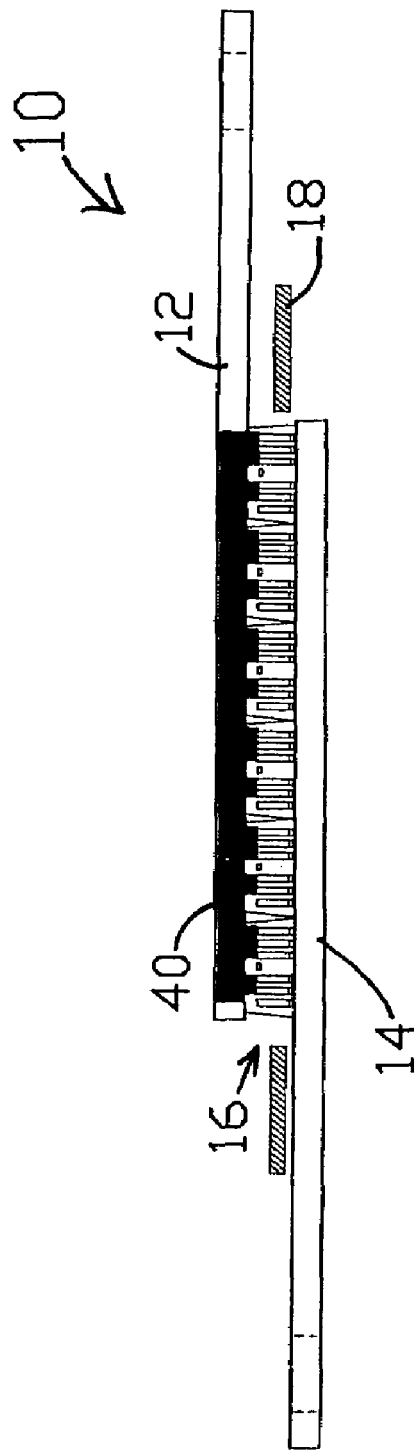
FIG. 2 is a partial side view of the high current electrical switch of FIG. 1 with part of the printed circuit board cutaway for illustration purposes.
Figure 2A:
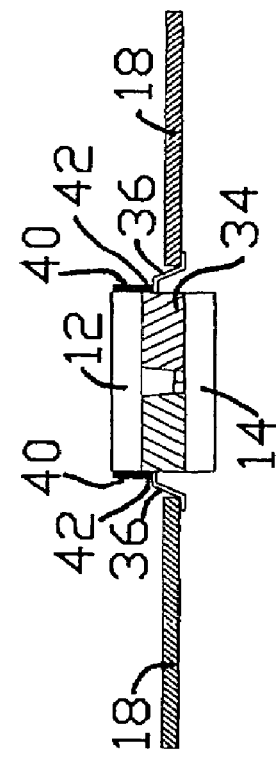
Figure 3:
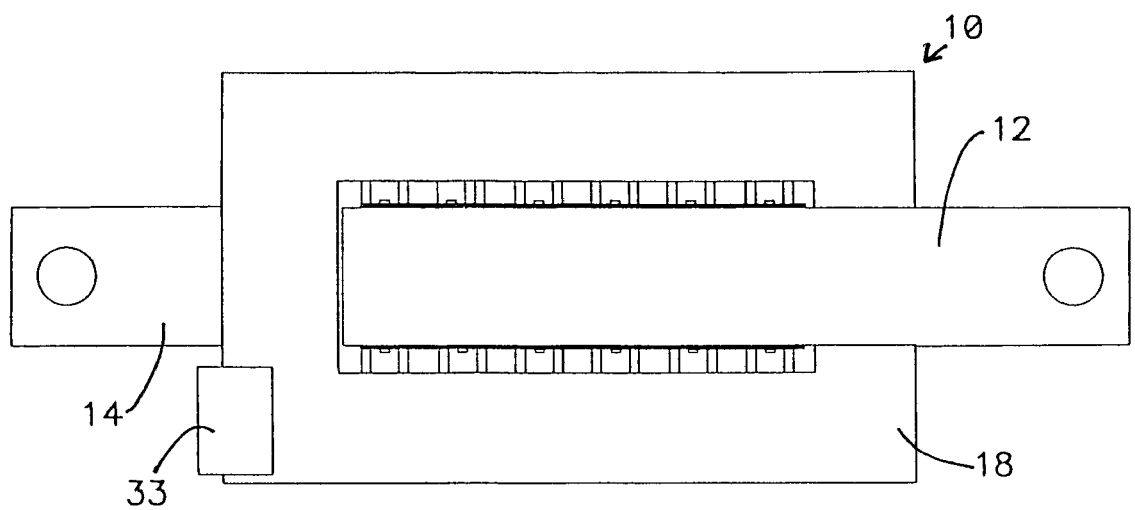
FIG. 3 is a top view of the high current electrical switch of FIG. 1.
Figure 4:
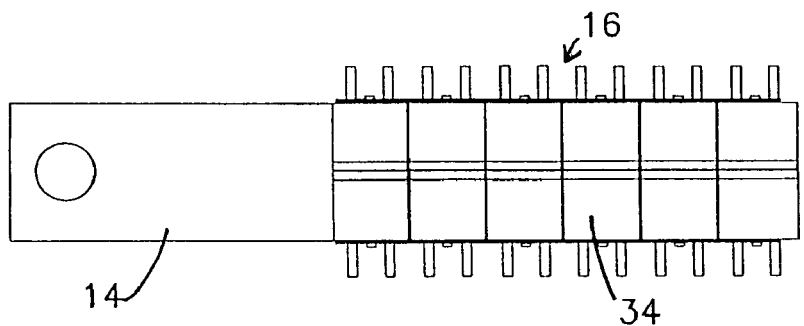
FIG. 4 is a partial top view of the high current electrical switch of FIG. 1 with the top conductor and printed circuit removed for illustration purposes.

Referring to FIG. 2A, an end cross-sectional view of switch 10 is shown. Metal strip 40 may connect the first rectangular bar 12 to source leads 36 of the switching devices 34. Tabs 42 of metal strip 40 depend substantially from the bottom of the first rectangular bar 12 to the source leads 36. The tabs 42 may connect to the source leads directly adjacent to the body of the switching device 34. The ratio of the height of these tabs 42 versus their cross-sectional area may be kept as low as possible to reduce the amount of resistance added to the switch 10 due to the metal strip 40 and to improve the conduction of heat from the source lead 36 to the first rectangular bar 12. The height of the tabs 42 is substantially the distance from the bottom of the first rectangular bar 12 to the top of the source lead 36. The source leads 36 may be connected on the printed circuit board 18 for mechanical interconnect purposes.

Figure 5:
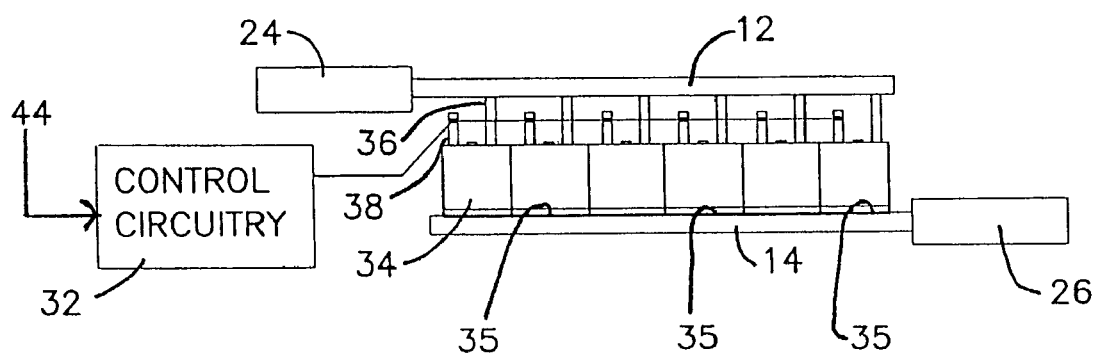
FIG. 5 is an electrical schematic of the high current electrical switch of FIG. 1.

Printed circuit board 18 may be rectangular in shape with an interior rectangular cutout slightly larger than the size of the array 16 of switching elements 34. Other shapes and configurations may also be employed. Each of the gate leads 38 may be electrically connected together on the printed circuit board 18 and may be controlled by control circuit 32 as shown in FIG. 5. The control circuit 32 may reside on the printed circuit board along with additional circuits and devices providing audio and/or visual indicators. The printed circuit board may also include an external connector 33 to provide control of switch 10. Each of the source leads 36 may also be electrically connected together on the printed circuit board 18.

Referring now to FIG. 5, an electrical schematic for the high current electrical switch 10 is shown. Array 16 may include a plurality of switching devices 34 connected in parallel between bar 12 and bar 14. The drain lead 35 of each switching element 34 may be connected directly to bar 14. The source leads 36 of each switching element 34 may be connected directly to bar 12. The gate lead 38 of each switching element 34 may be connected to the control circuit 32, which is controlled by an external input 44. When control circuit 32 is commanded by the external input 44 to close switching elements 34 via gate leads 38, current in cable 24 may flow through bar 12, switching elements 34, and bar 14 to cable 26. When control circuit 32 is commanded by external input 44 to open switching elements 34, current from cable 24 may not flow to cable 26.

Figure 6:
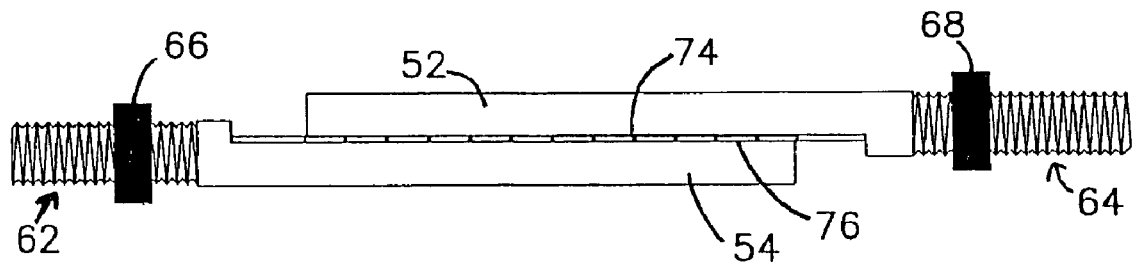
FIG. 6 is a side view of a second embodiment of a high current electrical switch.
Figure 7:
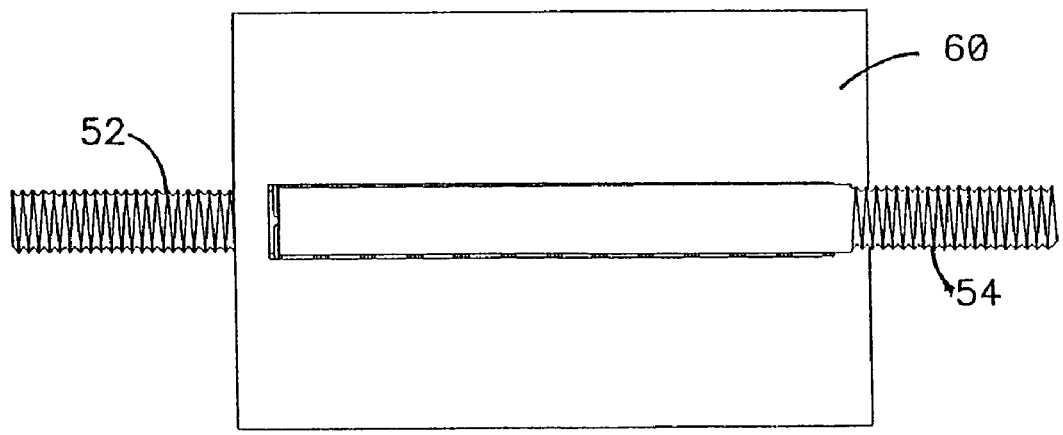
FIG. 7 is a top view of the high current electrical switch of FIG. 6.
Figure 8:
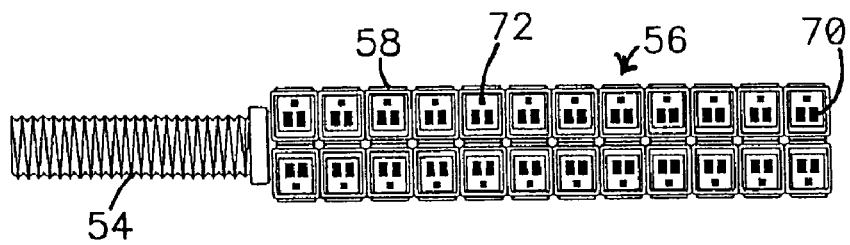
FIG. 8 is a partial top view of the high current electrical switch of FIG. 6 with the top conductor and printed circuit board removed.

Referring now to FIGS. 6-8, there is shown a second embodiment of a high current electrical switch, generally referenced as 50. The switch 50 includes a first primary conductor 52, a second primary conductor 54, an array 56 of switching elements 58, and a printed circuit board 60. The conductors 52, 54 may be generally cylindrical with recessed flat portions 74, 76 for connecting with the switching elements 58. The conductors 52, 54 may include a threaded portion 62, 64 with fasteners 66, 68 for connection with power cables.

Array 56 may include twenty-four switching elements 58, such as International Rectifier's DirectFET™ MOSFET or other switching devices in die form. Other numbers and arrangements of the switching devices may also be employed.

Each of the switching elements 58 may include a drain area (not shown) as the top side of the switching element 58. The drain area may be soldered or otherwise electrically connected directly to the flat portion 76 of conductor 54. Each of the switching elements 58 may include a pair of source areas 70 and a gate area 72 on the bottom side of the switching element 58. The source areas 70 may be soldered or otherwise electrically connected directly to the flat portion 74 of conductor 52. The gate areas 72 may be soldered or otherwise electrically connected directly to the printed circuit board 60.

Printed circuit board 60 may be rectangular in shape with an interior rectangular cutout with a width slightly larger than the diameter of the conductors 52, 54 and a length slightly larger than the length of the array 56 of switching elements 58. Other shapes and proportions may also be employed. Each of the gate areas 72 may be electrically connected together on the printed circuit board 60 and controlled by a control circuit. The control circuit may reside on the printed circuit board along with additional circuits and devices providing audio and/or visual indicators. The printed circuit board may also include an external connector to provide control of switch 50.

The construction of the device reduces the resistance to an absolute minimum or at least to a great extent, where the power dissipation may be less than that required to create as much as about ten degrees Celsius rise above the ambient temperature of the cables conducting the maximum current. Therefore, the need for large costly heat sinks is greatly reduced or entirely eliminated for most applications.

For many applications, high current electrical switches constructed according to the present embodiments of the invention may well produce better performance in power management systems by a factor of about twenty to about a hundred times compared with currently available products. The disclosed switch uses an array of one or more (typically six to twenty-four) currently available MOSFET's as the switching element or elements. There can be a variety of numbers and arrangements of the switching elements employed with the switches of the embodiments of the invention.

The array of switching elements may be sandwiched between the primary conductors with the array having a cross-sectional area to length ratio as high as possible for most applications. The geometry for the array region may be square for many applications, however, other factors, such as connectivity and intrinsic physical outline of the MOSFETs, may suggest a rectangular or other arrangement of the switching elements. Units constructed with a two-by-six array may perform very closely with nearly square arrays such as three-by-three and four-by-four. Conversely, arrays consisting of a single row of MOSFETs may perform well below that of the suggested geometry.

The package outline may dictate the selection of an array style, depending on the package length to width ratio. For instance, if the MOSFET package is a square, then a square array may be most effective for many applications. However, if the length to width ratio is greater than about 1.25, then a rectangular array might be more suitable for many applications.

The primary conductors (whereby the external cables are attached) may be high ratio geometry (HRG) conductors, i.e. conductors having an effective length to cross-sectional area ratio as low as possible (typically less than between about 25 to about 40) to minimize the package resistance. These primary conductors may also function as heat conductors to efficiently transfer the heat generated by the MOSFET array to the connecting electrical cables. Both the electrical and thermal resistance through a solid may be given by the equation:

Θ=length divided by cross-sectional area times K

Where K is a constant for the selected material

The materials with the best characteristics of electrical and thermal conductivity for many applications may include silver and copper with nearly equal properties. The thermal conductivity of silver may be about 8% better than copper. Copper may be about 91 % better than aluminum. All other metals may well be relatively low thermal conductors. The electrical conductivity, or reciprocal of resistance, may be normalized to copper at a constant of about 1.0. The electrical conductivity of silver may be about 0.95, gold may be about 1.416, and aluminum may be about 1.64; all other metals may be relatively poor conductors. Therefore, it is evident that copper may be the best choice for thermal and electrical conductivity for many applications. Silver may be a close competitor to copper, but its cost may rule it out for certain applications, except for certain purposes such as for plating. For economy and strength, the preference for some applications may be silver plated copper. Plating with silver also may afford much better solderability. The ratio described above may be suitable for both electrical and thermal conductivity.

TABLE 1

| Array size | Conductor size in inches | Conductor L/A = ratio | μΩ/in. | Total Resistance of Conductors in μΩ |
|---|---|---|---|---|
| 1 × 2 | 0.125 × 0.4 | 0.4 + 1.5/0.05 = 38 | 13.33 | 25.33 × 2 = 51 |
| 1 × 4 | 0.125 × 0.4 | 0.8 + 1.5/0.05 = 46 | 13.33 | 30.67 × 2 = 62 |
| 1 × 12 | 0.125 × 0.4 | 2.5 + 1.5/0.05 = 80 | 13.33 | 53.33 × 2 = 107 |
| 2 × 2 | 0.125 × 0.8 | 0.4 + 1.5/0.1 = 19 | 6.67 | 12.7 × 2 = 25 |
| 2 × 4 | 0.125 × 0.8 | 0.8 + 1.5/0.1 = 23 | 6.67 | 15.3 × 2 = 31 |
| 2 × 6 | 0.125 × 0.8 | 1.2 + 1.5/0.1 = 27 | 6.67 | 18 × 2 = 36 |
| 3 × 3 | 0.125 × 1.2 | 0.6 + 1.5/0.15 = 14 | 4.44 | 7 × 2 = 14 |
| 4 × 4 | 0.125 × 1.6 | 0.8 + 1.5/0.2 = 11.5 | 3.33 | 7.7 × 2 = 15 |

TABLE 2

| Array size | Currently available $R_{ds(on)}$ value in μΩ | Effective Resistance of Array in μΩ | Total resistance of assembly in μΩ |
|---|---|---|---|
| 1 × 2 | 2000 | 1000 | 1051 |
| 1 × 4 | 2000 | 500 | 562 |
| 1 × 12 | 2000 | 167 | 274 |
| 2 × 2 | 2000 | 500 | 525 |
| 2 × 4 | 2000 | 250 | 281 |
| 2 × 6 | 2000 | 167 | 203 |
| 3 × 3 | 2000 | 250 | 264 |
| 4 × 4 | 2000 | 167 | 182 |

Table 1 shows the conductors' size and total resistance for a variety of array sizes. Table 2 shows the effective resistance of a variety of arrays and the total resistance of the switch assembly. Using the MOSFET array sandwiched between the primary conductors, the total resistance from input to output may be less than 250 micro-ohms. While conducting one hundred amperes, the power dissipated may be less than about 2.5 watts.

In practical applications, such as on board a vehicle, a one hundred ampere current in a single conductor may commonly be found in the charge circuit for the vehicle's battery. Common practice used in the automotive industry for certain applications may be to use AWG4 cable if the cable length is no more than a few feet. That size cable has a cross-sectional area of about 0.03 square inches and a resistance of about 250 micro-ohms per foot. Therefore, a rectifier or switch suitable for such a circuit that is constructed according to certain embodiments of the present invention may be the equivalent of less than about 1 foot of AWG4 cable. Thus, it can be seen that the introduction of such a rectifier or switch for control purposes may be of no significance as to voltage drop or heat dissipation. This may well open an opportunity for switching high current, and/or blocking high current for multiple battery applications, with little loss and temperature rise.

The package may be designed to significantly reduce the total resistance, which generates the heat in the first place. Paralleling several MOSFETs with an $R_{ds(on)}$ of about two milli-ohms may dramatically reduce the resistance for certain applications. The resultant of paralleling two MOSFETs may be about one milli-ohm; four MOSFETs may be about 500 micro-ohms; eight may yield a resistance of about 250 micro-ohms. With an array of eight MOSFETs, the power dissipated in the MOSFETs may be about 2.5 watts at a current of about 100 amperes or about 22.5 watts at about 300 amperes, if the temperature of the MOSFETs were to remain at about 25 degrees Celsius for certain applications. This is considerably less than the power dissipation in many or all currently available solid-state switches. As the availability of improved MOSFETs become available, the advantages of the disclosed techniques become even greater for many applications. Therefore, the power dissipated by the entire assembly from input to output may be sufficiently low to result in a temperature rise of less than about ten degrees eliminating or greatly reducing the need for large costly heat sinks or other heat dissipating devices and allowing the connecting electrical cables to be the primary means of conducting generated heat out of the assembly.

Since the power produced within the assembly may increase the temperature exponentially, it is imperative in many applications to eliminate as much resistance as possible. Each one micro-ohm reduction may result in a reduction of about ten milli-watts of heat dissipation at the 100 ampere level and about nine times that at about 300 amperes. Unless the temperature stabilizes at the desired level, a domino effect may result in thermal runaway. As the temperature increases, the voltage breakdown level for the MOSFET may well decrease. When one MOSFET within an array fails, the condition may quickly lead to total device failure for some applications. Aside from the heat generated within the MOSFETs, additional heat may be generated by the resistance of the elements connecting the array to the electrical source and load (battery and lamp, alternator and battery, generator and motor, etc.). The primary conductors sandwiching the array of switching elements may permit the elimination of a significant portion of the unnecessary resistance in the total assembly for most applications.

The following steps may be taken to design an assembly in accordance with this invention:

A. Select the maximum current to be handled by the device
B. Specify the cable size in accordance with the maximum current and the length of the cables
C. Determine the number of MOSFETS required for the selected max current
D. Choose package style
E. Determine the array style most suitable
F. Choose a primary conductor size that exceeds the cable cross-sectional area
G. Select the appropriate circuit board for the array characteristics chosen The planar blades may be replaced with other HRG geometries, such as concentric rectangles, triangles and others, especially where the switching element may be more suitable for these configurations. Other configurations such as cylindrical adaptations of the sandwiched conductors may be equally suitable for certain applications, once appropriate magneto resistive, electro resistive materials or other suitable materials become available.

Examples of devices constructed in accordance with embodiments of this invention may achieve about 100 ampere operation with about two watts of dissipation in a package of about seven cubic inches weighing less than about ten ounces, and exhibiting a temperature rise of less than about five degrees Celsius above ambient. Electrical power systems in transportation, communication, power generating facilities, material handling, entertainment and computing platforms may well benefit dramatically using relays, rectifiers and switches constructed according to embodiments of the present invention.

As used herein, the word "about" indicates possible variations of plus or minus 20 percent.

While particular embodiments of the present invention have been disclosed, it is to be understood that various different modifications and combinations are possible and are contemplated within the true spirit and scope of the disclosed embodiments and the appended claims. For example, unpackaged MOSFET in die form may also be employed. There is no intention, therefore, of limitations to the exact disclosure herein presented.

What is claimed is:

1. A high current electrical switch, comprising:
a first primary conductor having a first flat surface;
a second primary conductor having a second flat surface;
the first and second surfaces each having substantially the same width;
an array of two or more switching elements electrically connecting the first primary conductor to the second primary conductor and physically sandwiched between the first primary conductor and the second primary conductor and mounted on and extending between the first and second flat surfaces thereof;
the array having substantially the same width as the flat surfaces; and
a printed circuit board permanently fixed substantially around the array of switching elements and mounted at least partially between the primary conductors to form a package;
wherein the printed circuit board includes an opening for receiving the array; and
wherein the electrical switch including the first and second primary conductors has a resistance of less than about 500 micro-ohms.

2. The switch of claim 1, wherein each of the conductors has an effective resistance of less than 20 micro-ohms.

3. The switch of claim 1, wherein the printed circuit board includes a circuit to control the switching elements.

4. The switch of claim 1, wherein the switching elements are MOSFETs.

5. The switch of claim 4, wherein a drain lead of each MOSFET connects directly to the first primary conductor.

6. The switch of claim 4, wherein a source lead of each MOSFET connects directly to the second primary conductor.

7. The switch of claim 4, wherein a gate lead of each MOSFET connects directly to the printed circuit board.

8. The switch of claim 7, wherein a source lead of the MOSFET connects to the second primary conductor via a metal strip.

9. The switch of claim 8, wherein the metal strip includes tabs extending to the source leads of the MOSFET.

10. A high current electrical switch, comprising:
a first primary conductor having a first flat surface;
a second primary conductor having a second flat surface;
the first and second surfaces each having substantially the same width;
an array of at least two switching elements electrically connecting the first primary conductor to the second primary conductor and sandwiched between the first primary conductor and the second primary conductor and mounted on and extending between the first and second flat surfaces thereof:
the array having substantially the same width as the flat surfaces; and
a printed circuit board permanently fixed substantially around the array of switching elements and mounted at least partially between the primary conductors to form a package;
wherein the printed circuit board includes an opening for receiving the array; and
wherein each of the conductors has an effective length to cross-sectional area ratio of less than about 40.

11. The switch of claim 10, wherein each of the conductors has an effective resistance of less than 20 micro-ohms.

12. The switch of claim 10, wherein the printed circuit board includes a circuit to control the switching elements.

13. The switch of claim 10, wherein the switching elements are MOSFETs.

14. The switch of claim 13, wherein a drain lead of each MOSFET connects directly to the first primary conductor.

15. The switch of claim 13, wherein a source lead of each MOSFET connects directly to the second primary conductor.

16. The switch of claim 13, wherein a gate lead of each MOSFET connects directly to the printed circuit board.

17. The switch of claim 16, wherein a source lead of the MOSFET connects to the second primary conductor via a metal strip.

18. The switch of claim 17, wherein the metal strip includes tabs extending to the source leads of the MOSFET.

* * * * *